(12) United States Patent
Yu

(10) Patent No.: US 6,403,981 B1
(45) Date of Patent: Jun. 11, 2002

(54) DOUBLE GATE TRANSISTOR HAVING A SILICON/GERMANIUM CHANNEL REGION

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/633,209

(22) Filed: Aug. 7, 2000

(51) Int. Cl.[7] .................. H01L 29/04; H01L 31/20; H01L 31/036; H01L 31/0376

(52) U.S. Cl. .......................... 257/63; 257/616

(58) Field of Search .................. 257/63, 65, 66, 257/69, 284, 285, 286, 347, 352, 353, 354, 334, 434, 616, 742

(56) References Cited

U.S. PATENT DOCUMENTS

| | | | |
|---|---|---|---|
| 5,360,749 A | * | 11/1994 | Anjum et al. ............... 438/302 |
| 5,591,653 A | | 1/1997 | Sameshima et al. |
| 5,760,442 A | * | 6/1998 | Shigyo et al. ............... 257/347 |
| 5,910,015 A | * | 6/1999 | Sameshima et al. ........ 438/163 |
| 5,981,345 A | | 11/1999 | Ryum et al. |
| 6,124,614 A | * | 9/2000 | Ryum et al. ................. 257/347 |

* cited by examiner

*Primary Examiner*—David Nelms
*Assistant Examiner*—David Nhu
(74) *Attorney, Agent, or Firm*—Foley & Lardner

(57) ABSTRACT

A method of manufacturing an integrated circuit with a channel region containing germanium. The method includes providing an amorphous semiconductor material including germanium, crystallizing the amorphous semiconductor material, and doping to form a source location and a drain location. The semiconductor material containing germanium can increase the charge mobility associated with the transistor. A double gate structure can also be formed.

20 Claims, 5 Drawing Sheets

DOUBLE GATE TRANSISTOR HAVING A SILICON/GERMANIUM CHANNEL REGION

CROSS REFERENCE TO RELATED APPLICATIONS

The present application is related to U.S. application Ser. No. 09/633,312 filed on an even date herewith, by Yu, entitled "Double Gate Transistor Formed In A Thermal Process," assigned to the assignee of the present application and herein incorporated by reference. The present application is also related to U.S. application Ser. No. 09/599,141, entitled "A Process For Manufacturing Transistors Having Silicon/Germanium Channel Regions," filed on Jun. 22, 2000 by Yu and U.S. application Ser. No. 09/599,270, filed on Jun. 22, 2000 by Yu entitled "A Solid Phase Epitaxy Process for Manufacturing Transistor Shaving", assigned to the Assignee of the present application.

FIELD OF THE INVENTION

The present invention relates generally to integrated circuits (ICs) and methods of manufacturing integrated circuits. More particularly, the present invention relates to a method of manufacturing integrated circuits having transistors with specialized channel regions.

BACKGROUND OF THE INVENTION

Integrated circuits (ICs), such as, ultra-large-scale integrated (ULSI) circuits, can include as many as one million transistors or more. The ULSI circuit can include complementary metal oxide semiconductor (CMOS) field effect transistors (FETS). The transistors can include semiconductor gates disposed above a channel region and between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking characteristic of the silicon dioxide spacers. The deep source and drain regions are necessary to provide sufficient material to connect contacts to the source and drain regions.

As transistors become smaller, it is desirous to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon germanium (Si—Ge) epitaxial layer above a glass ($SiO_2$) substrate. The Si—Ge epitaxial layer can be formed by a technique in which a semiconductor thin film, such as, an amorphous silicon hydride (a-Si:H), an amorphous germanium hydride (a-Ge:H) or the like is melted and crystallized by the irradiation of pulse laser beams.

In a bulk type device, such as, a metal oxide semiconductor field effect transistor (MOSFET), the use of Si—Ge materials could be used to increase charge carrier mobility, especially hole-type carriers. A tensile strained silicon channel region, such as, a silicon channel containing germanium, can have carrier mobility 2–5 times greater than a conventional Si channel region due to reduced carrier scattering and due to the reduced mass of holes in the germanium-containing material. According to conventional Si—Ge formation techniques for bulk-type devices, a dopant implant molecular beam epitaxy (MBE) technique forms a Si—Ge epitaxial layer. However, the MBE technique requires very complicated, very expensive equipment and is not feasible for mass production of ICs.

Thus, there is a need for an integrated circuit or electronic device that includes channel regions with higher channel mobility. Further still, there is a need for transistors with a thin Si—Ge channel region and deep source and drain regions. Even further still, there is a need for a method of manufacturing a transistor having a thin Si—Ge channel region in a semiconductor substrate. Yet further, there is a need for a double gate transistor having a silicon/germanium channel. Yet even further, there is a need for an effluent method of manufacturing a double gate transistor having a channel containing germanium.

SUMMARY OF THE INVENTION

An exemplary embodiment relates to a method of manufacturing an integrated circuit on a substrate. The method includes providing a first amorphous semiconductor layer above a top surface of the substrate, annealing the first amorphous semiconductor layer to form a first crystallized layer, providing a second amorphous semiconductor layer including germanium above the first crystallized layer. The method also includes annealing the second amorphous semiconductor layer to form a second crystallized layer, providing a third amorphous semiconductor layer above the second crystallized layer, annealing the third amorphous semiconductor layer to form a third crystallized layer, providing a gate structure above the third crystallized layer, and doping the first, second and third crystallized layers. The first, second and third crystallized layers are doped at a source location and a drain location to form a source region and a drain region.

Another exemplary embodiment relates to a transistor. The transistor includes a first gate conductor, a first dielectric layer, a first silicon layer, a silicon germanium layer, a second silicon layer, and a second dielectric layer. A first gate conductor is disposed above a top surface of a substrate.

The first gate dielectric layer is disposed below the first gate conductor and above the top surface of the substrate. The first silicon layer is disposed below the first dielectric layer and above the top surface of the substrate, and the silicon germanium layer is disposed above the top surface and below the first silicon layer. The second silicon layer is disposed above the top surface and below the silicon germanium layer. The second dielectric layer is disposed above the top surface and below the second silicon layer.

Another exemplary embodiment relates to a process of forming a transistor having a semiconductor germanium channel region above a top surface of a substrate. The process includes providing a dielectric layer above a top surface of the substrate, forming a gate conductor below the top surface of the substrate, providing a first amorphous semiconductor layer above the dielectric layer. The process further includes forming a first crystallized layer from the first amorphous semiconductor layer, providing a second amorphous semiconductor layer including germanium above the first crystallized layer, forming a second crystallized layer from the second amorphous semiconductor layer, and providing a third amorphous semiconductor layer above the second crystallized layer. The process further includes forming a third crystallized layer from the third amorphous semiconductor layer, and providing a gate structure above the third crystallized semiconductor layer.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
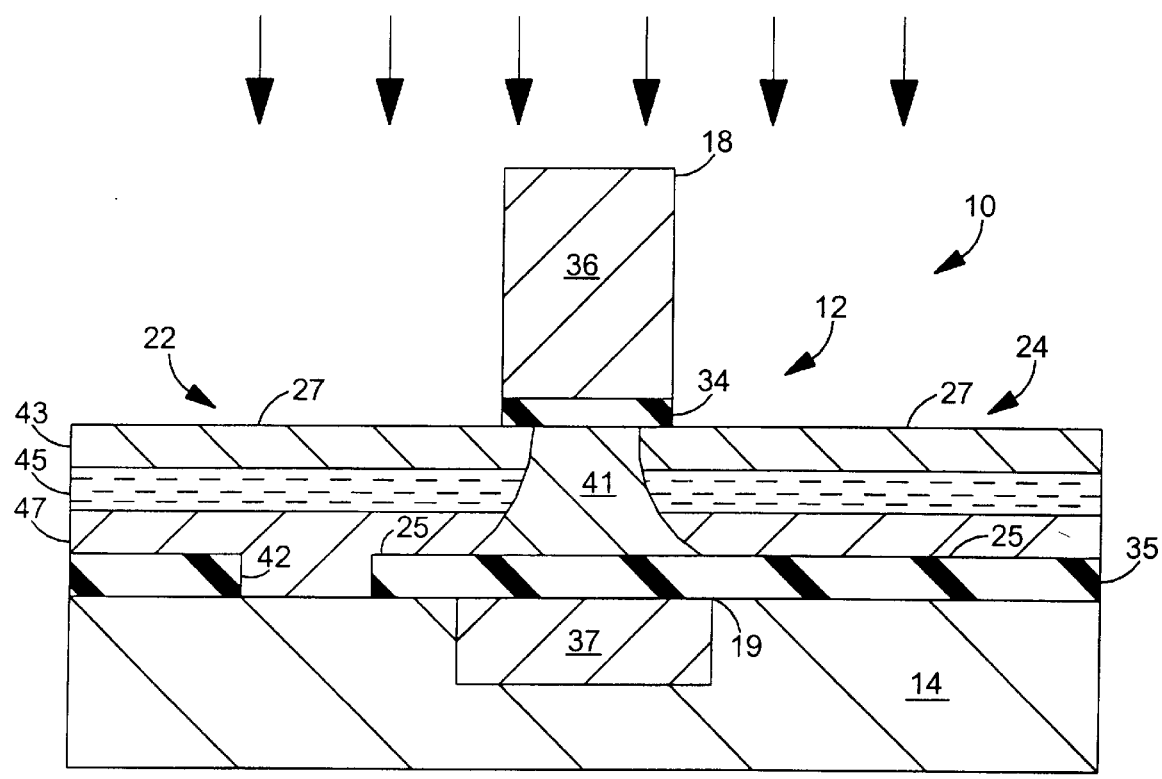
FIG. 1 is a cross-sectional view of a portion of an integrated circuit in accordance with an exemplary embodiment, the integrated circuit including a transistor provided on a portion of a substrate, the transistor having a channel region which includes a semiconductor and germanium material.

With reference to FIG. 1, a portion 10 of an integrated circuit (IC) includes a transistor 12 which is disposed on a semiconductor substrate 14, such as, a wafer. Semiconductor substrate 14 is preferably a semiconductor-on-insulator (SOI) substrate, (preferably silicon-on-glass). Alternatively, substrate 14 30 can be an N-type well in a P-type substrate, an insulative substrate, a bulk P-type single crystalline (001) silicon substrate or other suitable material for transistor 12.

Transistor 12 can be a P-channel or N-channel metal oxide semiconductor field effect transistor (MOSFET). Transistor 12 is preferably embodied as a fully depleted (FD), double gate, SOI MOSFET and includes a gate structure 18, a gate structure 19, a source region 22, and a drain region 24. Gate structures 18 and 19 advantageously provide a double gate structure that provides increased drive current and high immunity to short channel effects.

Regions 22 and 24 extend from a top surface 27 of portion 10 to a top surface 25 of a dielectric layer 35. Regions 22 and 24 are preferably 400–1000 Å from top surface 27 to top surface 25 of layer 35 (junction depth) and can include a source extension and a drain extension below top surface 27. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants (e.g., $5 \times 10^{19}$–$1 \times 10^{20}$ dopants per cubic centimeter). Appropriate dopants for a P-channel transistor include boron, boron diflouride, or iridium, and appropriate dopants for an N-channel transistor include arsenic, phosphorous, or antimony.

Gate stack or structure 18 includes a gate dielectric layer 34 and a gate conductor 36. Dielectric layer 34 is preferably comprised of a thermally grown, 15–25 Å thick silicon dioxide material. Alternatively, deposited silicon nitride ($Si_3N_4$) material or high-K gate dielectric materials can be utilized.

Gate structure 18 can also include a pair of sidewall spacers. Spacers can be manufactured in a conventional deposition and etch-back process. Alternatively, other insulative material such as nitride can be utilized to form spacers.

Conductor 36 is preferably deposited as polysilicon by chemical vapor deposition (CVD) and etched to form the particular structure for transistor 12. Conductor 36 is preferably doped polysilicon. Alternatively, conductor 36 can include metal, such as a refractory metal, or germanium to adjust the work function of transistor 12. Gate structure 18 has a height or thickness of 800–1200 Å.

Gate structure 19 includes a dielectric layer 35 and a gate conductor 37. Gate conductor 37 is preferably a heavily doped (N+) back gate for transistor 12. Conductor 37 is a buried structure provided in substrate 14. Conductor 37 is referably 500–2000 Å wide and 500–2000 Å deep. Conductor 37 can be electrically coupled to conductor by conductive vias or other structure depending upon the layout design for portion 10 of the integrated circuit. Conductor 37 is located underneath dielectric layer 35.

Dielectric layer 35 can be similar to layer 34 and be a deposited or grown silicon dioxide or nitride material. Alternatively, high-K gate dielectric materials can be utilized. Preferably, layer 35 is a 12–20 Å back gate oxide thermally grown on a silicon substrate, such as, substrate 14.

Layer 35 advantageously includes a window 42. Window 42 can be utilized as a short between substrate 14 and layer 47 or for contact to conductor 37 depending upon layout design. The short between layer 47 and substrate 14 can also be covered by trench isolation. Window 42 is utilized to provide proper seeding for layer 47 as discussed with reference to FIGS. 4–6.

A channel region 41 is disposed between gate structure 18 and gate structure 19. Channel region 41 is fabricated to have increased charge carrier mobility. Channel region 41 has a width slightly less than the gate length of gate structure 18 (e.g., 35 nm–100 nm) and advantageously includes a semiconductor containing germanium. The width of region 41 is downwardly diverging between structures 18 and 19, having a narrower width at a junction with gate structure 18 than the width at a junction with gate structure 19.

Channel region 41 can include a thin silicon cap layer 43, a thin silicon germanium layer 45, and another silicon cap layer 47. Alternatively, semiconductor material other than silicon can be utilized in layers 43, 45 and 47. Thus, channel region 41 is comprised of a compound structure including layers 43, 45 and 47. Layers 43 and 47 advantageously protect the integrity of layers 34 and 35 from the effects of germanium in layer 45.

In a preferred embodiment, layer 45 is 200–400 Å thick, and layers 43 and 47 are each 100–150 Å thick. Therefore, layer 45 is located from 100–150 Å above top surface 25 of layer 35 and from 100–150 Å below top surface 27 of layer 43.

Channel region 41 including layers 43, 45 and 47 is preferably as deep as regions 22 and 24. The use of layer 45 including germanium allows the mobility of carriers to be approximately 2–5 times larger than if channel region 41 were comprised solely of silicon material. The mechanical stress associated with layer 45 increases the carrier mobility for channel 41 (e.g., stress-enhanced mobility).

A silicide layer can be formed in regions 22 and 24. The silicide layer can be deposited or sputtered on top of source region 22 and drain region 24 for connection to contacts. Metal contacts can be coupled to regions 22 and 24 via the silicide layer. Conventional metal silicidation techniques can be utilized. For example, titanium silicide, cobalt silicide, tungsten silicide, and other silicides can be utilized.

Siliciding regions 22 and 24 can consume the portion of regions 22 and 24 that includes germanium (associated with layer 45). Thus, the performance of regions 22 and 24 is not adversely impacted by the presence of germanium.

With reference to FIGS. 1–10, the fabrication of transistor 12, including channel region 41, is described as follows. The advantageous process allows channel region 41 to include germanium and yet does not require MBE equipment. The process also allows dual gate structures 18 and 19 to be efficiently formed.

Figure 2:
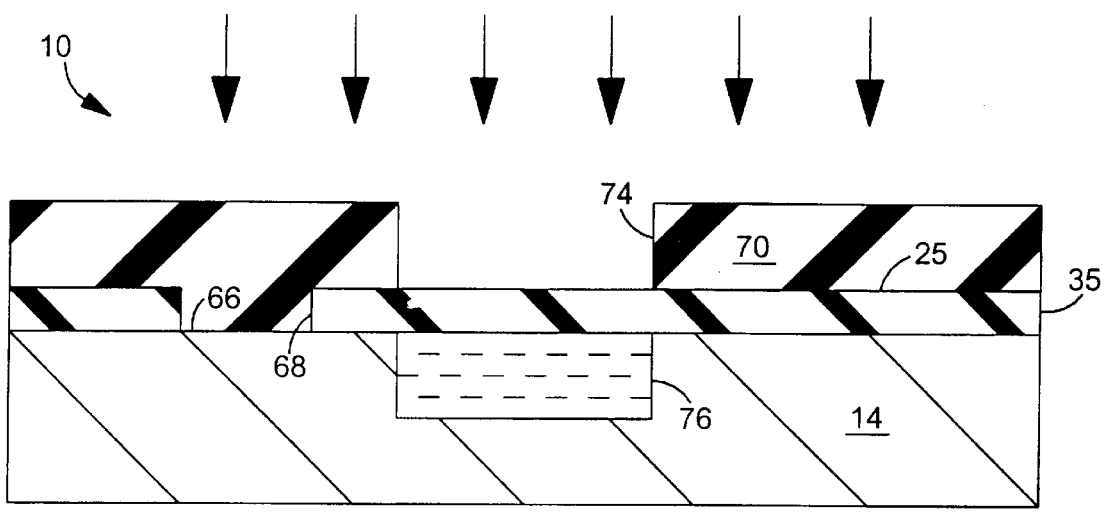
FIG. 2 is a cross-sectional view of the portion of the substrate illustrated in FIG. 1 showing an amorphization implant and a dopant implant step.

In FIG. 2, an SOI semiconductor substrate 14 including a silicon thin film is provided. Substrate 14 can be provided as part of a semiconductor wafer. Substrate 14 has a planarized top surface 66. Substrate 14 includes dielectric layer 35 on top surface 66. Dielectric layer 35 is preferably thermally grown on top of layer 66 to a thickness between 12 and 20 Å. A hole or window 68 is formed in layer 35 by a photolithic process. Preferably, window 68 is etched in a one step lothography process. Window 68 can be utilized as a seeding window during subsequent silicon recrystallization. After layer 35 is grown and window 68 is formed. A photo resist layer 70 is deposited on a top surface 75 of dielectric layer 35. After deposit of layer 70, a photolithographic graphic process is utilized to define a window 74 for defining gate conductor 37 (FIG. 1).

Preferably window 74 is 500–2000 Å wide. Photo resist layer 70 can be any type of photo resist material utilized in semiconductor fabrication processes.

After window 74 is formed, substrate 14 is subjected to a very heavy dose amorphization implant. Preferably, the amorphization implant can utilize an on implantation technique. The ion implantation technique can use neutral semiconductor ions, such as, silicon or germanium ions, at approximately 10–100 (keVs) and implant them into substrate 14. Ion implantation can be performed by implantation devices manufactured by companies, such as, Varian Company Palo Alto, Calif., Genius Company, and Applied Materials, Inc. The silicon and germanium ions change the single crystal silicon associated with substrate 14 into an amorphous material at a region 76. The amorphous material associated with region 76 is represented by a stippled area in FIGS. 2–4.

Preferably, germanium ions are provided at a very heavy dose. Alternatively, other species may be provided, such as silicon, xenon, or other dopants. Portions of substrate 14 outside of window 76 are protected by border resist layer 70. After the amorphization implant, region 76 is doped to provide increased conductivity. Preferably, region 76 is doped with an N+dopant implant utilizing species such as phosphorous, or arsenic. Alternatively, P+dopant implants can be utilized.

Figure 3:
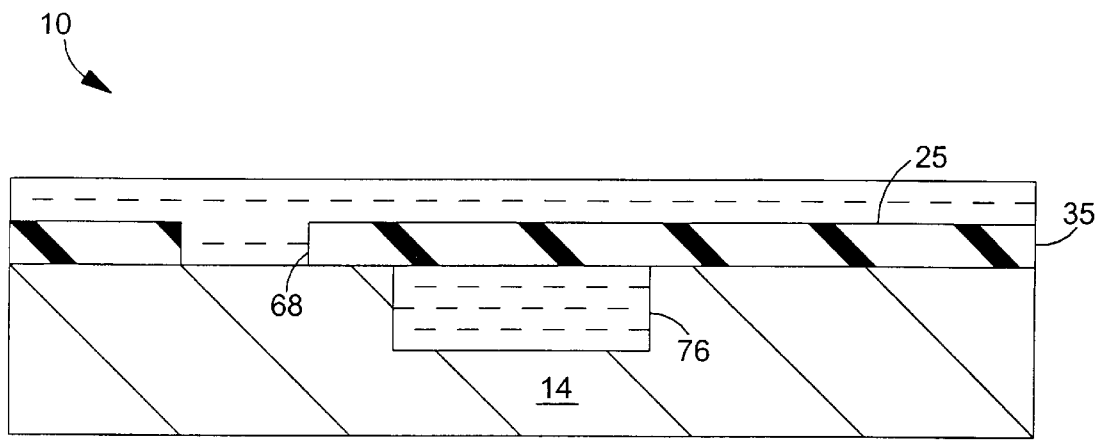
FIG. 3 is a cross-sectional view of the portion of the substrate illustrated in FIG. 2, showing a first amorphous semiconductor deposition step.

In FIG. 3, resist material 70 is removed by a conventional process. After material 70 is removed, a low pressure chemical vapor deposition (LPCVD) is utilized to deposit or provide a very thin amorphous semiconductor layer, such as, an amorphous silicon layer 78 above a top surface 25 of layer 35. Layer 78 preferably is provided within window 68 and contacts substrate 14. Preferably, layer 78 is deposited as a 100–300 Å thick amorphous silicon layer at a temperature of 400–450° C.

Figure 4:
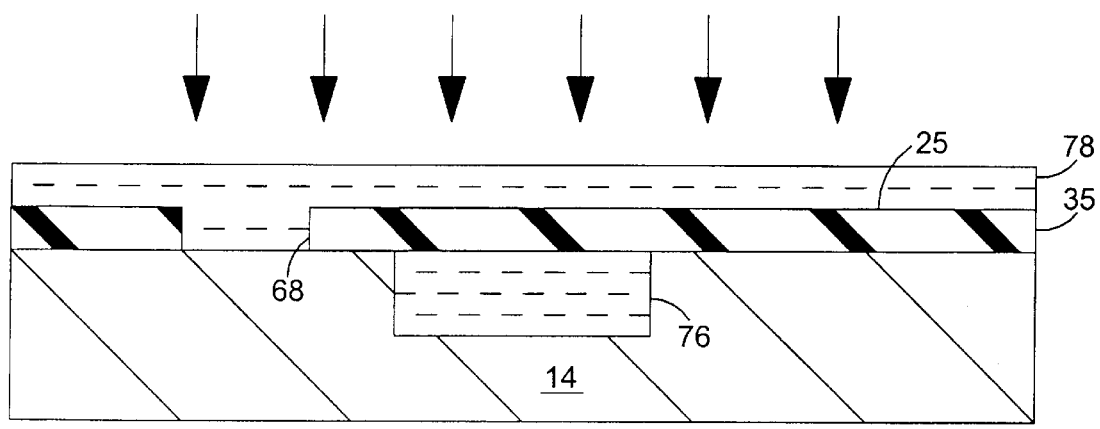
FIG. 4 is a cross-sectional view of the portion of the substrate illustrated in FIG. 3, showing a first annealing step.
Figure 5:
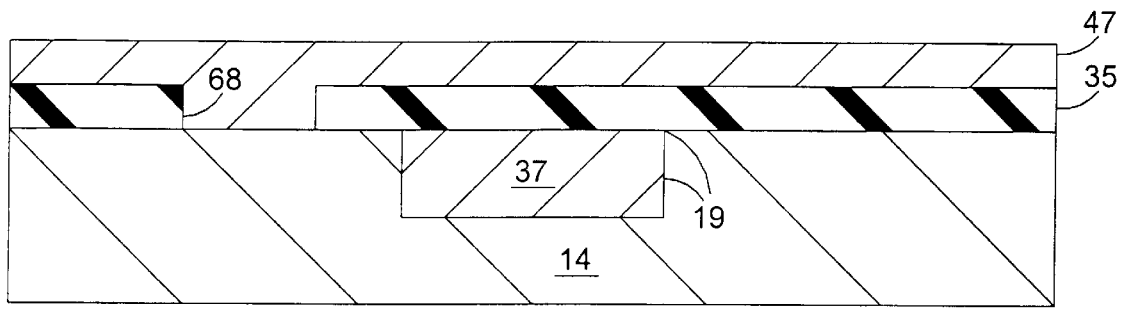
FIG. 5 is a cross-sectional view of the portion of the substrate illustrated in FIG. 4, showing a first recrystallization step.

In FIG. 4, after layer 78 is deposited, substrate 14 is subjected to an annealing process. The annealing process changes the structure of layer 78 (FIG. 4) from an amorphous state to a single crystalline state by melting layer 78, which subsequently recrystallizes as layer 47 (FIG. 5). In FIG. 5, amorphous layer 78 (FIG. 4) recrystallizes as layer 47. In addition, region 76 (FIG. 4) recrystallizes and becomes gate conductor 37. Dopants in gate conductor 37 are well activated due to the melting and recrystallization process. Window 68 allows substrate 14 to be utilized as a seed layer for layer 47.

In one embodiment, a solid phase epitaxy technique is utilized to crystallize layer 47. Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystal structure (silicon, silicon/germanium, or germanium) start layer. Solid phase epitaxy is usually achieved by heating the amorphous semiconductor layer. Alternatively, a low temperature (e.g., 550–600° C.) rapid thermal anneal can be utilized.

In another alternative, the annealing process is an excimer laser anneal process having a pulse duration of several nanoseconds and a wavelength of 308 nm. Excimer laser annealing can raise the temperature of layer 78 to the melting temperature of layer 78 (1100° C. for silicon). The melting temperature of layer 78 in the amorphous state is significantly lower than that of substrate 14 which is in the crystalline state. For example, the melting temperature of amorphous silicon is 1100° C. and the melting temperature of single crystal silicon is 1400° C. Preferably, the excimer laser annealing process is controlled so that layer 47 is fully melted and substrate 14 is not melted. After the energy associated with the annealing process is removed, layer 78 is recrystallized as a single crystal material (e.g., layer 47).

Figure 6:
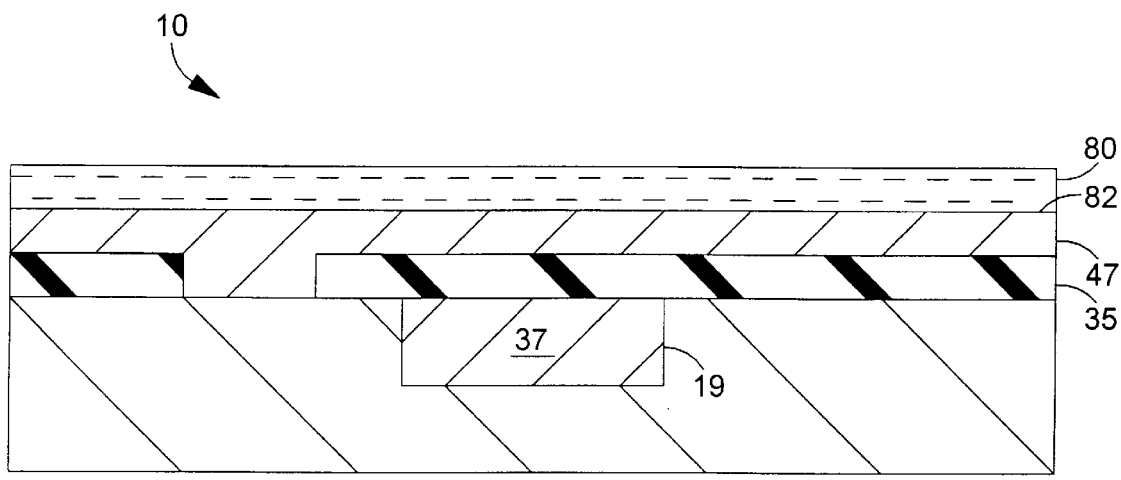
FIG. 6 is a cross-sectional view of the portion of the substrate illustrated in FIG. 5, showing a second amorphous semiconductor deposition step, the amorphous semiconductor including germanium material.
Figure 7:
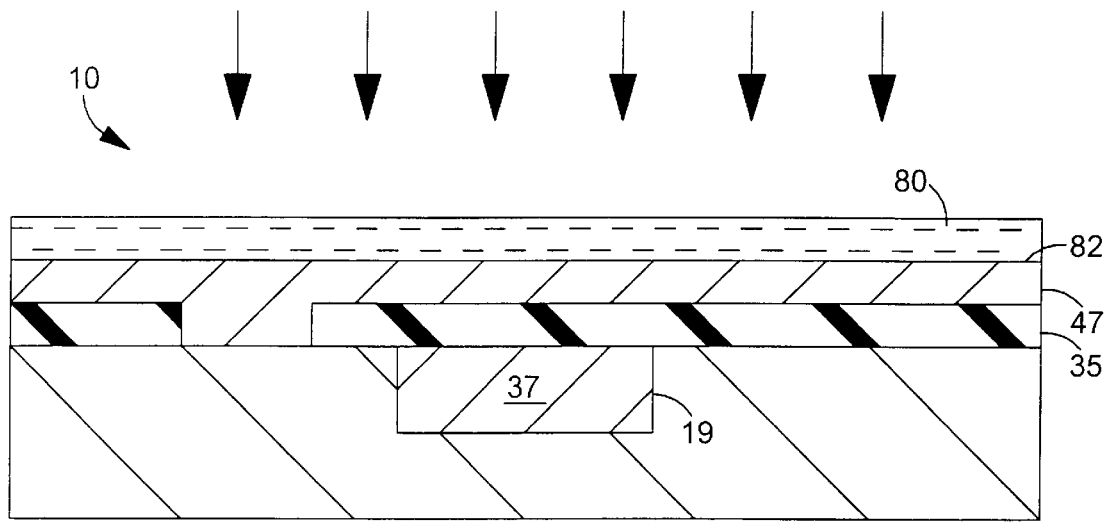
FIG. 7 is a cross-sectional view of the portion of the substrate illustrated in FIG. 6, showing a second annealing step.
Figure 8:
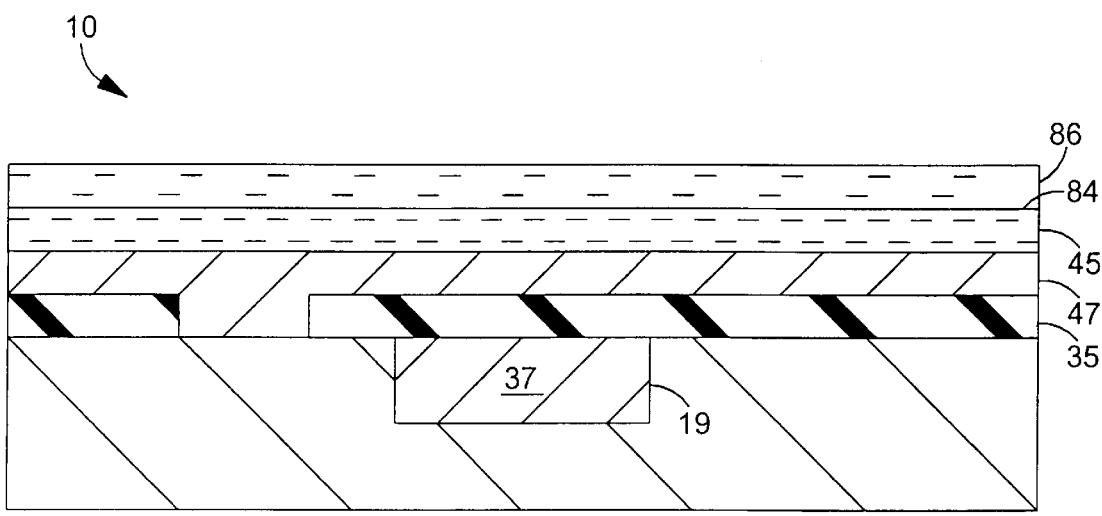
FIG. 8 is a cross-sectional view of the portion of the substrate illustrated in FIG. 7, showing a second recrystallization step.

In FIG. 6, a low pressure chemical vapor deposition (LPCVD) is utilized to deposit or provide a very thin amorphous semiconductor germanium layer, such as, an amorphous silicon germanium layer 80 above a top surface 82 of layer 47. Preferably, layer 80 is deposited as a 200–400 Å thick layer on top surface 82 at a temperature of 400–450° C. In FIG. 7, layer 80 is annealed in a similar process to that described with respect to layer 78 in FIGS. 4–5. Preferably, layer 80 is annealed by an excimer laser beam (e.g., 308 nm wave lengths). In FIG. 8, layer 80 recrystallizes in a process similar to that discussed with reference to FIGS. 4–5 except that layer 80 provides the seed layer for recrystallization as layer 45. After layer 45 recrystallizes, a layer 86 is deposited by LPCVD on a top surface 84 of layer 45. Layer 86 is preferably an amorphous semiconductor layer, such as, amorphous silicon, having a thickness of approximately 200 Å.

Figure 9:
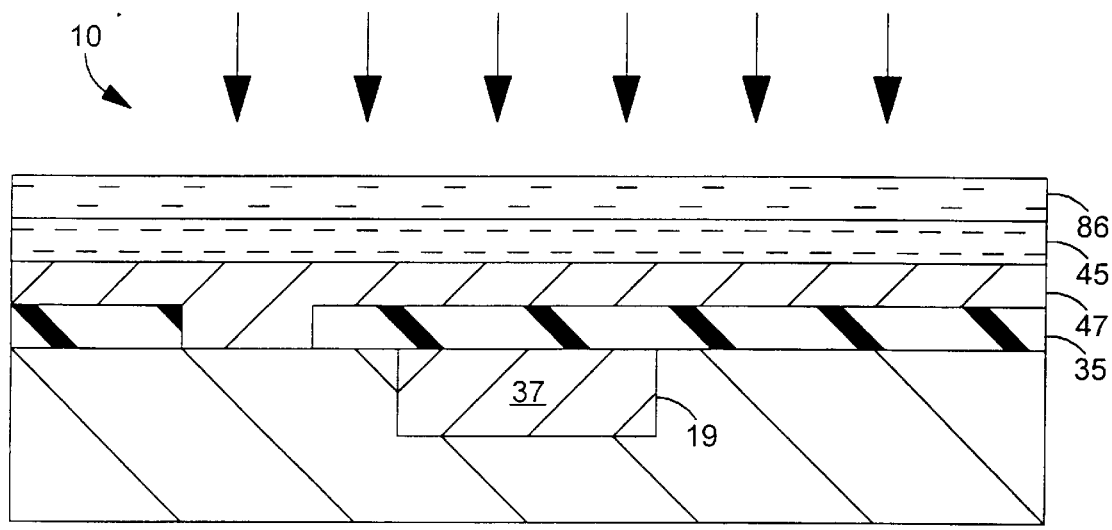
FIG. 9 is a cross-sectional view of the portion of the substrate illustrated in FIG. 8, showing a third annealing step and a third recrystallization step.
Figure 10:
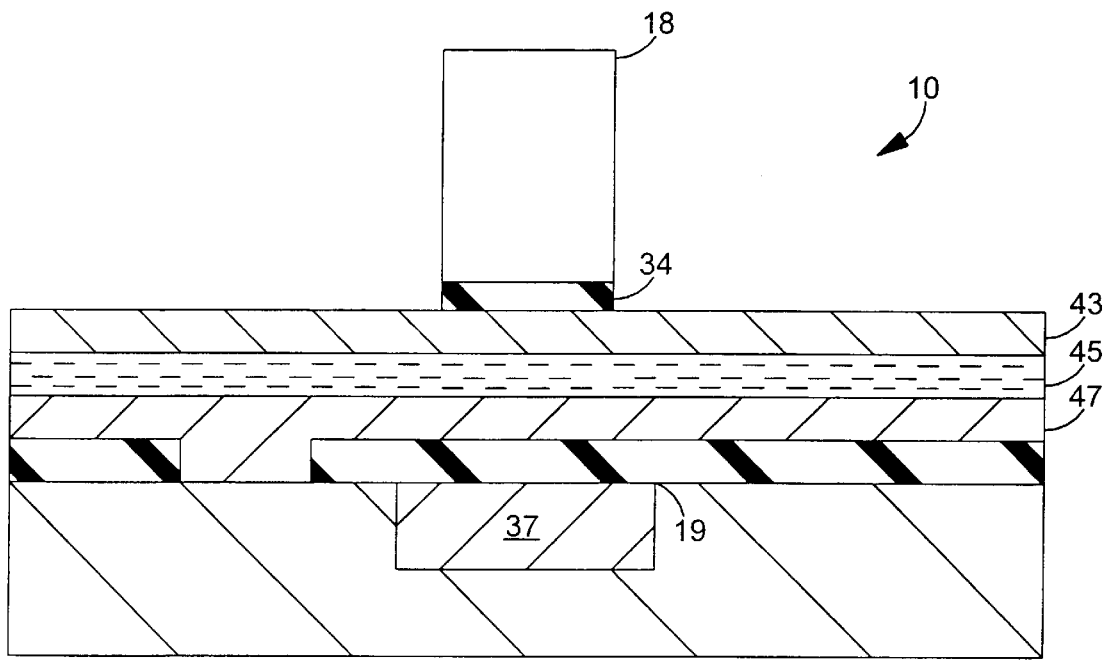
FIG. 10 is a cross-sectional view of the portion of the semiconductor substrate illustrated in FIG. 9, showing a gate structure formation step.

In FIG. 9, layer 86 is annealed in a process similar to that utilized to anneal layer 80 (FIG. 7). After annealing, layer 86 is recrystallized as layer 43 (FIG. 10) in a process similar to the process discussed with reference to FIGS. 4–5 except that layer 45 operates as a start or seed layer for layer 43. In FIG. 10, after layer 43 is recrystallized, gate structure 18 can be formed according to a conventional process. After gate structure 18 is formed, a conventional N+dopant implant can be utilized to form source 22 and drain 24. In addition, gate conductor 36 can be doped when source 22 and drain 24 are doped.

After regions 22 and 24 are formed, a silicidation process can form silicide regions within regions 22 and 24. The silicide regions can be formed by depositing a metal layer and siliciding the metal layer. Generally, sixty-percent of the total thickness of the metal layer consumes layers 43, 45, 47.

After the silicide regions are formed, transistor 12 and integrated circuit 10 can be subjected to conventional CMOS processes to form contacts and interconnects. In addition, insulating layers can be provided over transistor 12 to otherwise complete the fabrication of portion 10.

Principles, structures and examples discussed in the related patent application filed on an even date herewith by Yu entitled "Double Gate Transistor Formed In A Thermal Process" can be utilized in the embodiments of the present application. This application is incorporated herein by reference.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of capping layers and semiconductor germanium layers are shown, other structures can be utilized. Various changes may be made to the details disclosed without departing from the spirit of the invention which is defined by the following claims.

What is claimed is:

1. An integrated circuit including a transistor comprised of a first gate conductor disposed above a top surface of a substrate a first dielectric layer below the first gate conductor and above the top surface, a first crystallized silicon layer below the first dielectric layer and above the top surface of the substrate, a crystallized silicon germanium layer above the top surface and below the first crystallized silicon layer, a second crystallized silicon layer above the top surface and below the crystallized silicon germanium layer; and a second dielectric layer below the top surface and below the second crystallized silicon layer and a second gate conductor disposed below the second dielectric layer, wherein a portion of the first crystallized silicon layer, the second crystallized silicon layer, and the crystallized silicon germanium layer form a channel region, the transistor being manufactured by a method comprising:

providing a first amorphous semiconductor layer above a top surface of the substrate;

annealing the first amorphous semiconductor layer to form the first crystallized silicon layer;

providing a second amorphous semiconductor layer including germanium above the first crystallized layer;

annealing the second amorphous semiconductor layer to form the crystallized silicon germanium layer;

providing a third amorphous semiconductor layer above the crystallized silicon germanium layer;

annealing the third amorphous semiconductor layer to form the second crystallized silicon layer;

providing a gate structure above the second crystallized silicon layer; and doping the first crystallized silicon layer, the second cystallized silicon germanium layer and the third crystallized silicon layer at a source location and a drain location to form a source region and a drain region.

2. The integrated circuit of claim 1, further comprising:

before the providing a first amorphous semiconductor layer step, providing the dielectric layer above the substrate.

3. The integrated circuit of claim 2, further comprising:

before the providing a dielectric layer step, providing a buried gate conductor between the source location and the drain location.

4. The integrated circuit of claim 3, wherein the buried gate conductor is an amorphous semiconductor region.

5. The integrated circuit of claim 4, wherein the buried gate conductor is a doped region in the substrate.

6. The integrated circuit of claim 4, wherein the amorphous semiconductor layers include silicon.

7. The integrated circuit of claim 1, wherein the bulk substrate includes single crystalline silicon.

8. The integrated circuit of claim 1, wherein the first annealing step is an excimer laser annealing step.

9. The integrated circuit of claim 8, wherein the second annealing step is an excimer laser annealing step.

10. The integrated circuit of claim 1, wherein the annealing steps takes place at a temperature sufficient to melt the amorphous semiconductor layers and below the melting temperature of the substrate.

11. The integrated circuit of claim 1, wherein the doping step provides dopants to the first gate conductor.

12. A transistor, comprising:

a first gate conductor disposed above a top surface of a substrate;

a first dielectric layer below the first gate conductor and above the top surface;

a first silicon layer below the first dielectric layer and above the top surface of the substrate;

a silicon germanium layer above the top surface and below the first silicon layer;

a second silicon layer above the top surface and below the silicon germanium layer;

a second dielectric layer below the top surface and below the second silicon layer; and a second conductor below the second dielectric layer, wherein the channel region includes a portion of the first silicon layer, the silicon germanium layer, and the second silicon layer.

13. The transistor of claim 12, wherein the second gate conductor is a heavily doped back gate below the top surface of the substrate.

14. The transistor of claim 12, wherein a source region and a drain region are disposed in the first silicon layer, the second silicon layer, and the silicon germanium layer.

15. The transistor of claim 13, wherein the silicon germanium layer is part of the channel region.

16. The transistor of claim 12, wherein the first and second silicon layers are each 100–300 Å thick.

17. The transistor of claim 16, wherein the silicon germanium layer is 200–400 Å thick.

18. A transistor having a semiconductor germanium channel region above a top surface of a substrate, the transistor comprising:
- a dielectric layer above a top surface of the substrate;
- a gate conductor below the top surface of the substrate;
- a first crystallized semiconductor layer above the dielectric layer;
- a second crystallized semiconductor layer including germanium above the first crystallized semiconductor layer;
- a third crystallized semiconductor layer above the second crystallized semiconductor layer; and
- a gate structure above the third crystallized layer wherein the channel region includes portions of the first crystallized semiconductor layer, the second crystallized semiconductor layer and the third crystallized semiconductor layer.

19. The transistor of claim 18, further comprising:
- a source region and a drain region for the transistor, the source region and the drain region extending into the substrate.

20. The transistor of claim 19, wherein the first crystallized semiconductor layer is 100–300 Å thick, the second crystallized semiconductor layer is 200–400 Å thick, and the third semiconductor crystallized layer is 100–300 Å thick.

* * * * *